United States Patent [19]

Kinoshita

[11] Patent Number: 5,069,591
[45] Date of Patent: Dec. 3, 1991

[54] SEMICONDUCTOR WAFER-PROCESSING APPARATUS

[75] Inventor: Kenichi Kinoshita, Machida, Japan
[73] Assignee: Tel Sagami Limited, Kanagawa, Japan
[21] Appl. No.: 328,096
[22] Filed: Mar. 23, 1989

[30] Foreign Application Priority Data

Mar. 24, 1988 [JP] Japan .................. 63-68187

[51] Int. Cl.⁵ .............................................. F27D 5/00
[52] U.S. Cl. ................................. 414/156; 414/180; 432/6; 432/152; 432/253
[58] Field of Search .............. 414/150, 152, 156, 173, 414/180, 198, 662, 669, 672, 917, DIG. 940; 432/5, 6, 152, 253

[56] References Cited

U.S. PATENT DOCUMENTS

| 4,468,195 | 8/1984 | Sasaki et al. | 414/180 X |
| 4,669,938 | 6/1987 | Hayward | 414/156 |
| 4,767,251 | 8/1988 | Whang | 414/152 X |
| 4,872,799 | 10/1989 | Fisher, Jr. | 414/180 |
| 4,954,079 | 9/1990 | Yamaga | 432/152 |

FOREIGN PATENT DOCUMENTS 62-7687 2/1987 Japan .
2190345 11/1987 United Kingdom ............ 414/940

Primary Examiner—Sherman Basinger
Attorney, Agent, or Firm—Oblon, Spivak, McClelland, Maier & Neustadt

[57] ABSTRACT

A semiconductor wafer-processing apparatus has a plurality of support members provided respectively for the processing units of a processing apparatus, and designed for supporting wafer receptacles each containing semiconductor wafers, and receptacle-inserting/extracting mechanism for inserting a wafer receptacle from the support members into the processing units, and for extracting the wafer receptacle from the processing units back to the support members. Receptacle-transporting mechanism is provided, operated independently of the receptacle inserting/extracting mechanism, for transporting the wafer receptacle between each support member and a predetermined position.

6 Claims, 6 Drawing Sheets

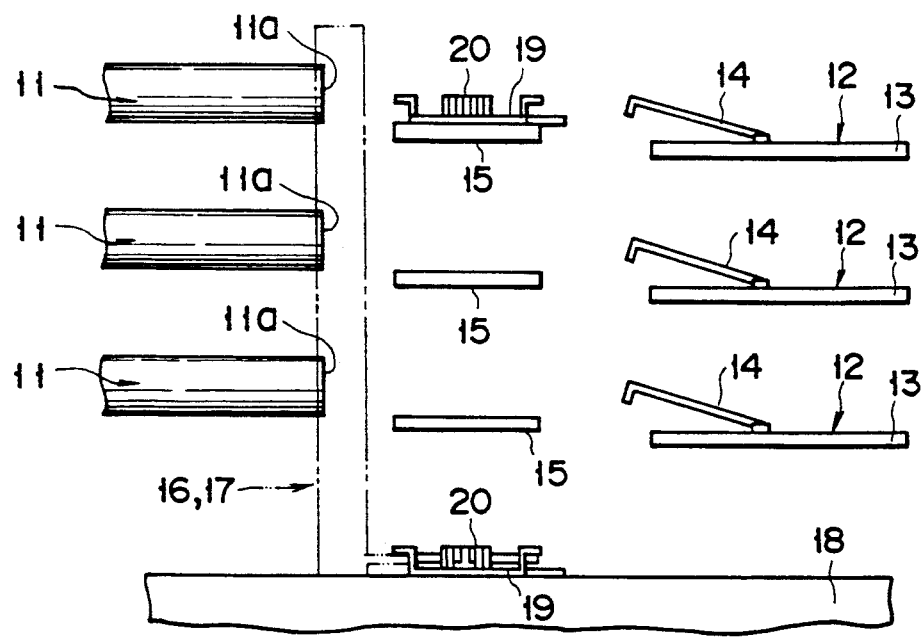
F I G. 1
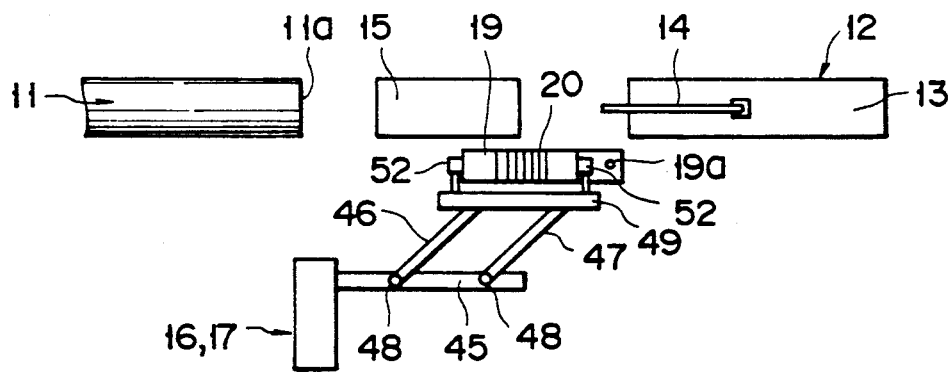
F I G. 2
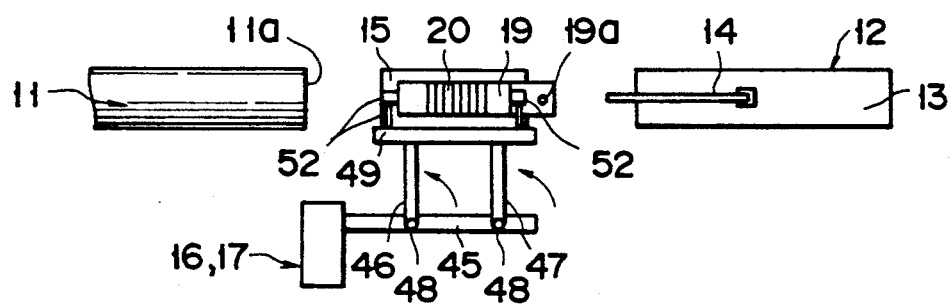
F I G. 3

5,069,591

SEMICONDUCTOR WAFER-PROCESSING APPARATUS

BACKGROUND OF THE INVENTION

1. Field of the Invention

The present invention relates to an apparatus for treating or processing semiconductor wafers and, more particularly to a semiconductor wafer-processing apparatus having a mechanism for transporting semiconductor wafers into and out of a plurality of processing units.

2. Description of the Related Art

An apparatus for heat-treating semiconductor wafers is known which comprises a plurality of horizontally extending heat-treatment furnaces arranged one above another, and a plurality of boat-inserting/extracting mechanism for inserting boats into the furnaces and extracting them from the furnaces. Semiconductor wafers mounted on each boat are moved into and pulled from the furnace as the boat is moved into and from the furnace by means of the corresponding boat-inserting-/extracting mechanism.

Japanese Patent Publication No. 62-76897 discloses an apparatus for transporting boats to boat-inserting/extracting mechanisms. This boat-transporting apparatus includes a combination of an elevator mechanism and a horizontal trans-port mechanism having a boat holder. In operation, the elevator mechanism moves the horizontal transport mechanism up or down to a desired furnace. Then, the horizontal transport mechanism is driven, thereby horizontally moving the boat holder close to the opening of the furnace. Finally, the boat-transporting mechanism moves a boat into, and from, the heat-treatment furnace.

The conventional boat-transporting apparatus is disadvantageous in some respect. Both the elevator mechanism and the horizontal transport mechanism remain idle until the boat-transporting mechanism inserts the boat into the heat-treatment furnace so that the wafers mounted on the boat are heat-treated within the furnace. More precisely, the elevator mechanism and the horizontal transport mechanism cannot perform their functions while the boat is being moved to and into any heat-treatment furnace. Obviously, the operating efficiency of the boat-transporting apparatus is low since the elevator mechanism and the horizontal transport mechanism remain idle for a long time.

The boat-transporting apparatus is disadvantageous in another respect. The apparatus cannot simultaneously take the heat-treated wafers from two or more furnaces. Until the horizontal transport mechanism is moved to the furnace after the wafers have been pulled out of a furnace, the heat-treated wafers in any other furnace must remain in the furnace. Consequently, these wafers are heated for a time longer than necessary, or heated in excess, failing to have quality as high as desired.

SUMMARY OF THE INVENTION

An object of the present invention is to provide a semiconductor wafer-processing apparatus which can transport semiconductor wafers to, into, and out of a plurality of processing units with high efficiency.

According to the present invention, there is provided a semiconductor wafer-processing apparatus which comprises: a plurality of support members provided, respectively, for the processing units of a processing apparatus, and designed for supporting wafer receptacles each containing semiconductor wafers; receptacle-inserting/extracting means for inserting the receptacles from the support members into the processing units, and for extracting the receptacles from the processing units back to the support members; and receptacle-transporting means for transporting the wafer receptacles between each support member and a predetermined position.

BRIEF DESCRIPTION OF THE DRAWINGS

FIG. 1 is a diagram schematically showing a semiconductor wafer-processing apparatus according to a first embodiment of the present invention;

FIG. 2 through FIG. 4 are diagrams explaining how the apparatus shown in FIG. 1 insets wafer-containing boats into heat-treatment furnaces, and pulls them out of the furnaces;

DETAILED DESCRIPTION OF THE PREFERRED EMBODIMENTS

Figure 4:
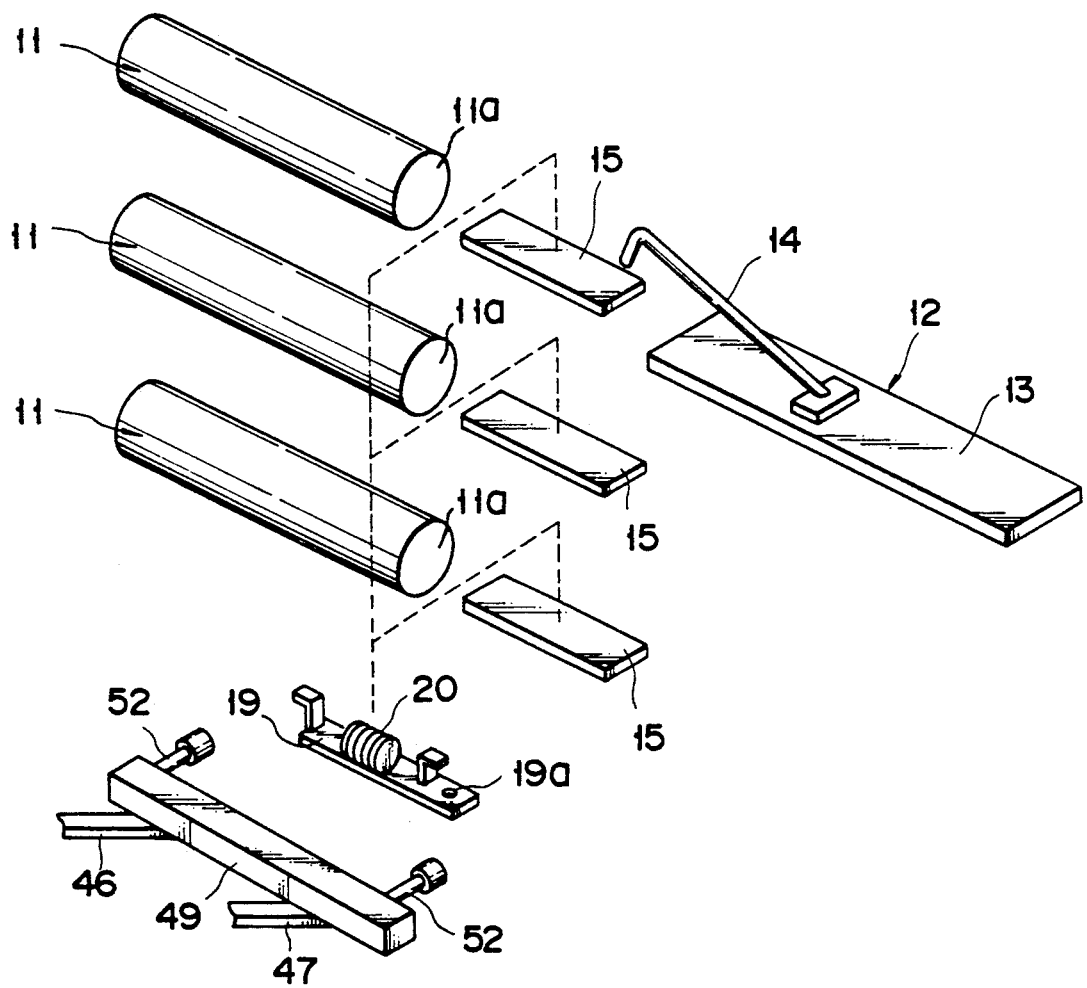

Embodiments of the present invention will now be described, with reference to the accompanying drawings. In the drawings, the identical reference numerals designate the same components.

FIGS. 1 to 5 illustrate a wafer-processing apparatus according to a first embodiment of the invention. As is shown in FIG. 1, a plurality of, for example, three, heat-treatment furnaces (processing units), more precisely horizontal heat-treatment furnaces 11, are arranged, one above another in a housing (not shown). (For the sake of simplicity, each furnace 11 is represented in FIG. 1 as a process tube.) Each heat-treatment furnace 11 has a wafer port 11a. A plurality of boat-inserting/extracting mechanisms 12 are horizontally aligned with the furnaces 11 and oppose the wafer ports 11a thereof respectively. Each boat-inserting/extracting mechanism 12 comprises a boat loader 13 and a quartz rod 14. The rod 14 is connected at one end to the boat loader 13 and can rotate up and down around this end. The other end of rod 14 bends downward, forming a hook. The boat loader 13 can be moved toward and away from the heat-treatment furnace 11, by means of a drive mechanism which will be later described.

A boat support plate 15 is located between each boat-inserting extracting mechanism 12 and the wafer port 11a of the furnace 11. The support plate 15 is made of, for example, quartz.

The wafer-processing apparatus further comprises a boat-transporting unit provided on a table 18. This unit has an elevator mechanism 16 and a horizontal transport mechanism 17, and is best shown in FIG. 5.

Figure 5:
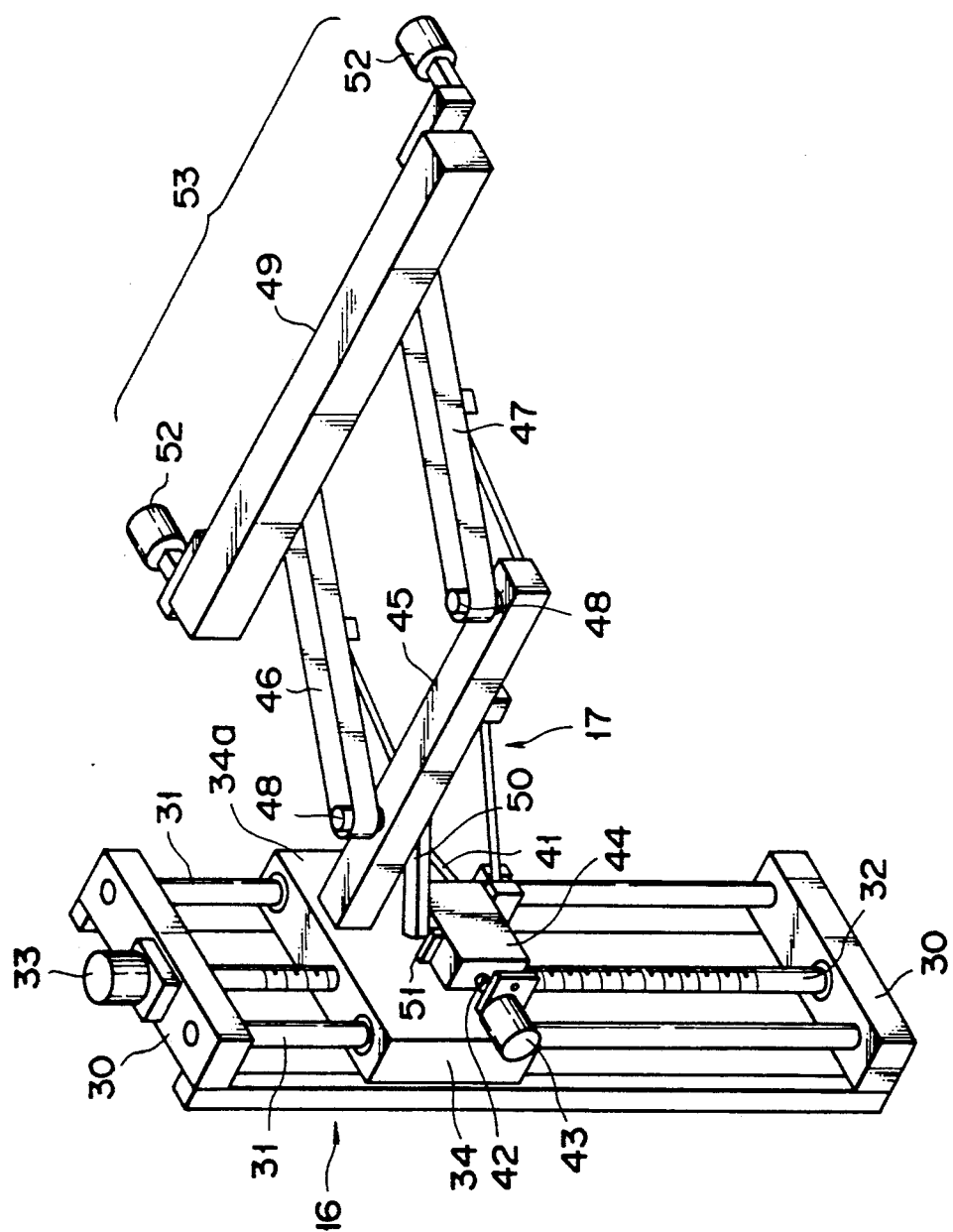
FIG. 5 is a perspective view showing the elevator mechanism and the horizontal transport mechanism of the apparatus illustrated in FIG. 1, which are designed to transport the boats vertically and horizontally.

As is shown in FIG. 5, the elevator mechanism 16 comprises a pair of frames 30 vertically spaced apart from each other. A pair of guide rails 31 is provided extending parallel between the frames 30. A feed screw 32 is provided between frames 30 parallel to and between the guide rails 31. The mechanism 16 further comprises an electric motor 33 mounted on the upper frame 30 and coupled to the feed screw 32. A vertically movable member 34 guided by rails 31 is set in screw engagement with the feed screw 32. When the feed screw 32 is rotated by the motor 33, the movable member 34 is moved up or down.

The horizontal transport mechanism 17 has a pair of guide rails 41, a feed screw 42, an electric motor 43, and a horizontally movable member 44. The rail 41 and the screw 43 are horizontally positioned on one side of the vertically movable member 34. The motor 43 is mounted on the vertically movable member 34 and connected to the feed screw 42. The horizontally movable member 44 is put in screw engagement with the feed screw 42. Hence, when the screw 42 is rotated by the motor 43, the member 44 is moved horizontally, in parallel to the side 34a of the vertically movable member 34.

A fixed arm 45 is secured to the side 34a, extending in the direction at right angles to the guide rails 41. Two arms 46 and 47 are rotatably connected, at one end, to the arm 45 by means of pins 48. They are pivotally connected, at the other end, to the end portions of a horizontally movable arm 49 by means of pins (not shown). Hence, arms 45, 46, 47 and 49 constitute a parallel link. A lever 50 is rotatably attached, at one end, to the lower surface of the arm 45 by means of a pin 48 which pivotally couples the arm 46 with the arm 45. The other end of this lever 50 abuts on a projection 51 projecting upward from the top of the horizontally movable member 44.

When horizontally movable member 44 is moved, the lever 50 rotates, whereby arms 46 and 47 also rotate. As a result, the horizontally movable arm 49 horizontally moves in parallel to the arm 45 secured to the vertically movable member 34. In other words, the parallel link opens or closes. As the link expands, the arm 49 moves toward the arm 45. Conversely, as the link contracts, the arm 49 moves away from the arm 45.

The horizontally movable arm 49 is a hollow member. A pair of air cylinders (not shown), for example, are provided within the arm 49 and connected in series. A piston is located in either cylinder. The pistons are connected to two boat holders 52 made of, for example, quartz. These boat holders 52 can move toward each other, or away from each other, by means of the air cylinders. The air cylinders and the boat holders constitute a boat-supporting mechanism 53.

It will be explained how the wafer-processing apparatus described above is operated. To subject wafers 20 to heat treatment in the heat-treatment furnaces 11 (see FIG. 1), the wafers 20 contained in a carrier (not shown) are placed in a quartz boat 19, and the boat 19 is put on the table 18, at a waiting position which is not right below the lowest boat support plate 15, but is slightly staggered with respect to the lowest boat support plate 15. Thereafter, the movable member 34 of the elevator mechanism 16 is lowered until the horizontal transport mechanism 17 reaches the waiting position. (At this time, the heat-treatment furnaces 11, boat tables 15, the waiting boat 19, the horizontally movable arm 49 are positioned as best shown in FIG. 4.) Next, the boat holders 52 of the boat-supporting mechanism 53 are moved toward each other, until they clamp the boat 19 placed at the waiting position. In this condition, the parallel link of the mechanism 17 is closed.

Thereafter, the vertically movable member 34 of the elevator mechanism 16 is raised until the horizontal transport mechanism 17 and the boat 19 supported by this mechanism 17 are moved to the boat support plate 15 opposing the desired furnace 11, for example, the uppermost furnace. When the mechanism 17 and the boat 19 reach this boat support plate 15, the mechanism 17 is driven, thereby opening the parallel link, as is shown in FIG. 2. As a result, the horizontally movable arm 49 moves away from the fixed arm 45, and the boat 19 is located above the boat support plate 15, as is shown in FIG. 3.

The vertically movable member 34 is then lowered a little, thus placing the boat 19 held by the boat holders 52 onto the boat support plate 15. Then, the boat holders 52 are moved away from each other, releasing the boat 19. The horizontally transport mechanism 17 is moved up a little. The parallel link is closed, thereby moving the horizontally movable arm 49 to the side of the boat support plate 15. The mechanism 17 is raised or lowered to the level at which the next desired furnace 11 is located.

The rod 14 of the boat loader 13 of each boat-inserting/extracting mechanisms 12 is set into engagement with the hole 19a made in the boat 19. Then, the boat loader 13 is horizontally moved toward the heat-treatment furnace 11, whereby the boat 19 slides on the boat support plate 15 and is eventually inserted into the furnace 11 through the wafer port 11a. The rod 14 is released from the hole 19a of the boat 19, and the boat loader 13 is horizontally moved away from the boat support plate 15. The insertion of the boat 19 into the furnace 11 can be performed independently of the operation of the elevator mechanism 16 or the horizontal transport mechanism 17. Hence, while the boat 19 is being inserted into the furnace 11, the mechanism 16 and 17 can transport a boat 19 to a boat support plate 15 opposing any other furnace 11, or transport a boat extracted on a boat surface plate from any other furnace 11 to the waiting position on the table 18.

Once the wafers 20 have been heat-treated in one furnace 11, the boat loader 13 is moved to the boat table 15, and the rod 14 is put into engagement with the hold 19a of the boat 19 placed within the furnace 11. Then, the boat loader 13 is moved away from the boat support plate 15, thus extracting the boat 19 from the furnace 11 onto the boat support plate 15. Needless to say, the boat 19 can be extracted from the furnace 11, without operating the elevator mechanism 16 or the horizontal transport mechanism 17. In other words, the extraction of the boat 19 can be performed independently of the operation of the mechanisms 16 and 17. The boat 19 extracted from the furnace 11 is held on the boat table 15 until the horizontal transport mechanism 17 moves up or down to the boat support plate 15. Since the boat 19 is already outside the furnace 11, the wafers 20 contained in the boat 19 are not further heated to have its quality degraded.

The vertically movable member 34 of the elevator mechanism 16 is raised to a position slightly lower than the boat support plate 15 supporting the boat 19. Then, the parallel link of the horizontal transport mechanism 17 is opened, thereby moving the horizontally movable arm 49 to a position right below the boat support plate 15. The boat holders 52 are moved toward each other until they clamp the boat 19. Thereafter, the vertically movable member 34 is moved upward, thus lifting the boat 19. The parallel link is then closed, and the member 34 is lowered until the boat 19 reaches the waiting position on the table 18. While the boat 19 is being transported, a boat 19 can be inserted into or extracted from any other furnace 11. As soon as the elevator mechanism 16 and the horizontal transport mechanism 17 transport one boat 19 to the waiting position on the table 18, they can start transporting another boat 19 to the waiting position.

Figure 6:
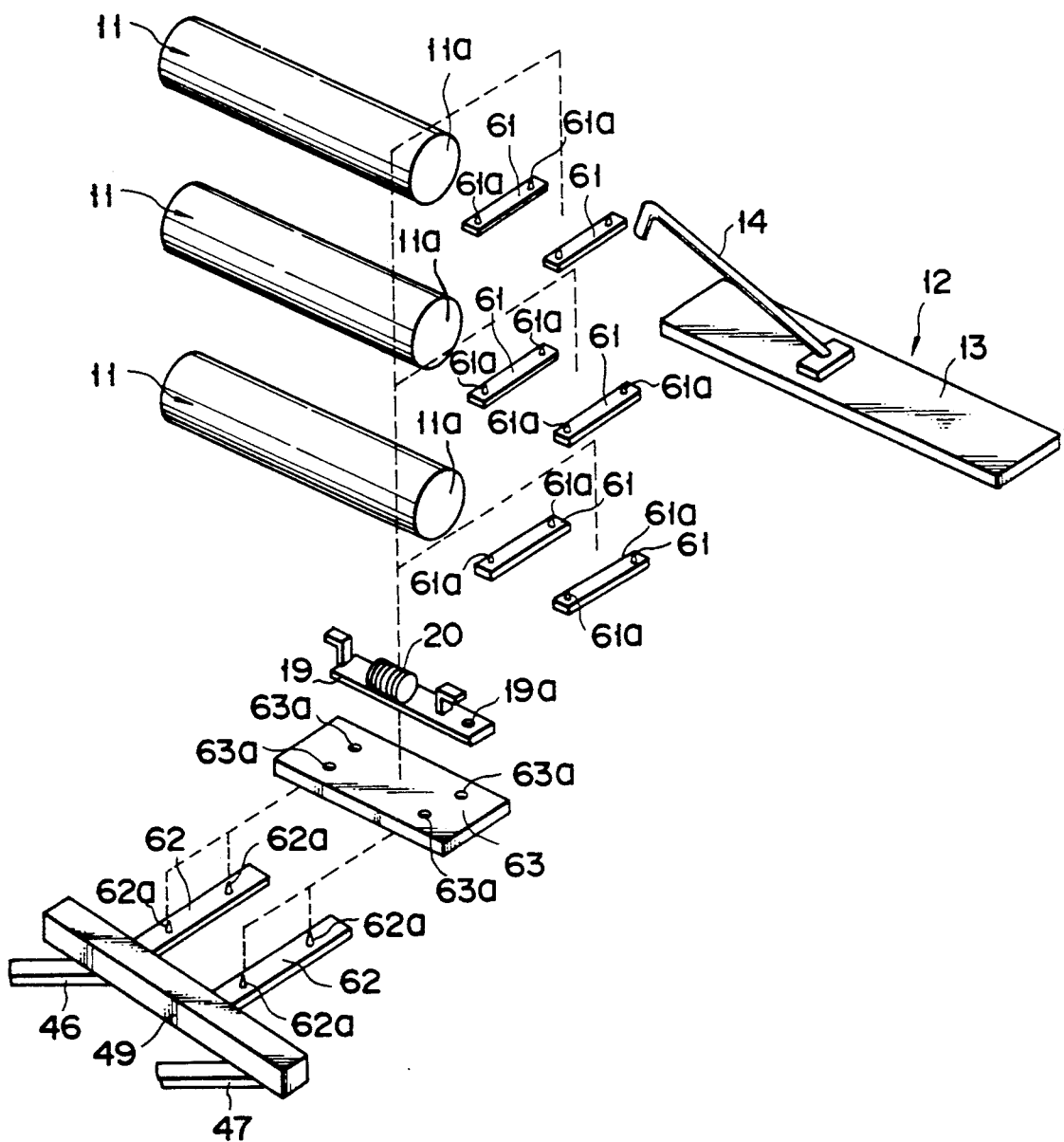
FIG. 6 is a diagram showing a wafer-transporting apparatus according to a second embodiment of the present invention

FIG. 6 illustrate a second embodiment of the invention. This apparatus is different from the apparatus shown in FIGS. 1 to 5 in two respects only. First, a pair of rods 61 is used instead of each boat support plate 15. Secondly, a pair of support rods 62 are used in place of the boat holders 52 of the boat-supporting mechanism 53. (For simplicity's sake, only one of the boat inserting-/extracting mechanism 12 is shown in FIG. 6, which are provided for heat-treatment furnaces 11, respectively.) As is evident from FIG. 6, a boat 19 is mounted on a boat tray 63 and transported to a desired position. The tray 63 has four holes 63a cut in the corners. Projections 61a are formed on the rods 61 and positioned so as to go into the holes 63a when the boat tray 63 is placed on the rods 61. Similarly, projections 62a are formed on the support rods 62 and positioned so as to fit into the holes 63a when the boat tray 63 is placed on the support rods 62.

The apparatus shown in FIG. 6 operates, basically in the same way as the apparatus illustrated in FIGS. 1 to 5, but its operation will be described briefly. First, the boat 19 containing wafers 20 is mounted on the boat tray 63. Then, the boat tray 63 is placed on the support rods 62, whereby the projections 62a of the rods 62 fit into the holes 63a of the support 63. The elevator mechanism 16 and the horizontal transport mechanism 17 as described above are operated, thus transporting the tray 63 and, hence, the boat 19 to the rods 61 located in front of the desired heat-treatment furnace 11. The boat tray 63 is transferred from the support rods 62 to the rods 61. When the tray 63 is thus transferred, the projections 61a of the rods 61 fit into the holes 63a. Thereafter, the boat inserting/extracting mechanism 12 inserts the boat 19 from the tray 63 into the heat-treatment furnace 11.

After the wafers 20 have been heat-treated, the boat inserting/extracting mechanism 12 extracts the boat 19 out of the furnace 11, and moves the boat 19 onto the tray 63. Then, the elevator mechanism 16 and the horizontal transport mechanism 17 cooperate, thus releasing the boat tray 63 from the rods 61, and then transporting the tray 63 to the boat-holding position on the table 18.

As may be understood from the above, the apparatus shown in FIG. 6 has the same advantages as that apparatus illustrated in FIGS. 1 to 5.

Figure 7:
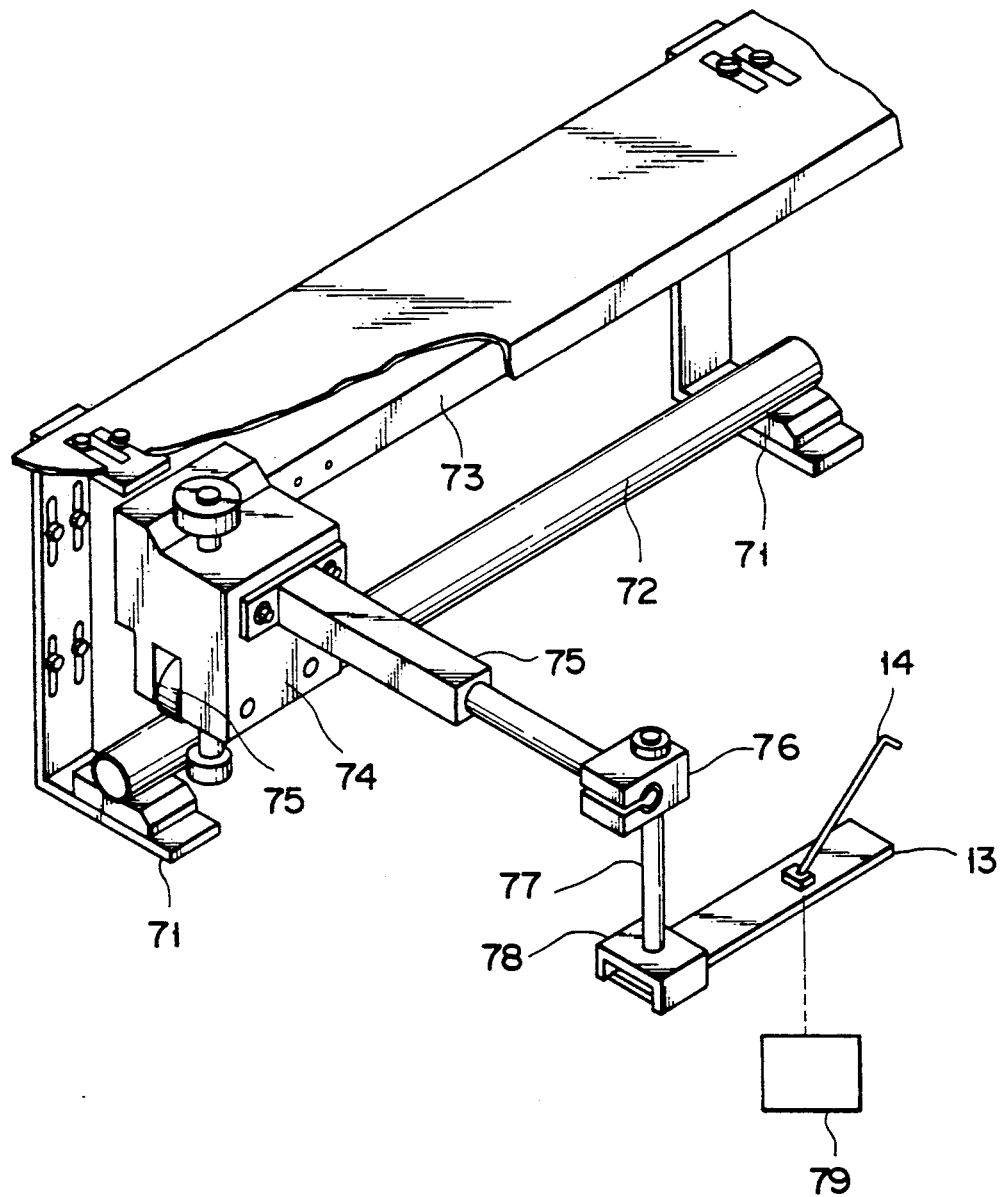
FIG. 7 is a diagram illustrating the device for driving the boat-inserting/extracting mechanism of the apparatus.

FIG. 7 illustrates a device for driving the boat-inserting/extracting mechanism used in either apparatus described above. This device comprises a pair of supports 71 set apart in the horizontal direction, a guide rod 72 having ends supported on these supports 71, a movable member 73 mounted on the guide rod 72, and a drive belt 74 for moving the member 73 back and forth on the guide rod 72. A connecting rod 75 protrudes from the side of the movable member 73 in the direction at right angles to the side of the member 73. A coupling 76 connects a support rod 77 to the distal end of the rod 75, such that the rod 77 extends downward from the distal end of the rod 75. A holder 78 is coupled to the lower end of the support rod 77. The holder 78 holds a boat loader 13. The rod 14 of the boat loader 13 is rotated up or down by a drive mechanism 79, so as to go into or out of the engagement with the hole 19a of the boat 19.

Figure 8:
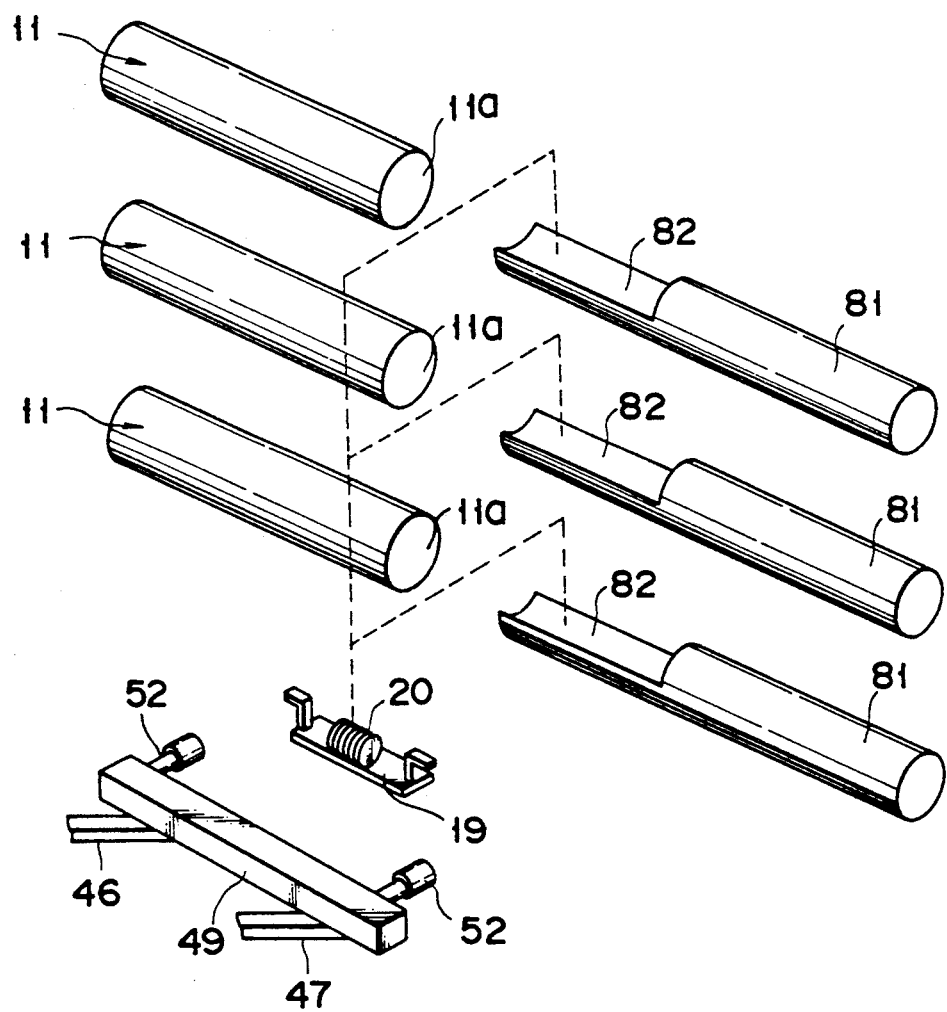
FIG. 8 is a diagram showing a wafer-transporting apparatus according to a third embodiment of the present invention.

FIG. 8 shows the wafer-transporting apparatus according to a third embodiment of the invention. This apparatus is different from the apparatus shown in FIGS. 1 to 5 and also from the apparatus shown in FIG. 6, only in that boat inserting/extracting mechanisms of a different type are employed. Each of the boat inserting/extracting mechanisms comprises a fork 81 and a boat-supporting member 82 integrally formed with the fork 81.

In operation, a boat 19 containing wafers 20 is mounted on the boat-supporting member 82 by means of the elevator mechanism 16 and the horizontal transport mechanism 17 in the same way as has been described with reference to FIGS. 1 to 5. The fork 81 is inserted into the heat-treatment furnace 11 by means of a soft-landing mechanism (not shown), keeping the boat-supporting member 82 out of contact with the inner surface of the furnace 11. When the boat-supporting member 82 reaches a prescribed position within the furnace 11, the fork 81 is lowered slowly, thus achieving a soft-landing of the boat 19 within the heat-treatment furnace 11. Then, the fork 81 is moved out of the furnace 11. The soft-landing mechanism can be of the type disclosed in U.S. Pat. No. 4,008,815 issued to Fisk or U.S. Pat. No. 4,468,195 issued to Sasaki et al., or the type disclosed in U.S. patent application Ser. No. 07/273,063 now U.S. Pat. No. 4,888,994 (Title: Method of Carrying Objects Into and From a Furnace, and Apparatus for Carrying Objects Into and From a Furnace) filed by Shin NAKAMAKI and Yuzuru SASAHARA on Nov. 8, 1988, and assigned to TEL Sagami Limited, all of which are incorporated herein by reference.

As has been described, the wafer-processing apparatus according to the present invention can transport a boat containing wafers from a waiting position to a heat-treatment furnace, and vice versa. Also, the apparatus can inset the boat into the furnace or extract the boat therefore, while transporting a boat from any other furnace to the boat-holding position. The apparatus can therefore help to increase the efficiency of the heat treatment of wafers. In addition, since the wafers are transported from the furnace to the boat-support member immediately after they have been heat-treated to a desired extent, they are not excessively heated to have their quality degraded.

The present invention has been described as applied to the wafer-heating apparatus, but it is not limited thereto. For example, the present invention can be applied to a semiconductor wafer-etching apparatus, a resist-coating apparatus, and a resist-developing apparatus.

What is claimed is:

1. A semiconductor wafer-processing apparatus which comprises:
   a plurality of support members provided respectively for processing units of a processing apparatus, and designed for supporting wafer receptacles each containing semiconductor wafers;
   receptacle-inserting/extracting means for inserting a wafer receptacle from the support members into the processing units, and for extracting the wafer receptacle from the processing units back to the support members; and receptacle-inserting/extracting means, for transporting the wafer receptacle between each support member and a predetermined position;

wherein said receptacle-transporting means comprises a horizontal transport mechanism and an elevator mechanism for vertically moving the horizontal transport mechanism, said horizontal transport mechanism including a fixed arm, a horizontally movable arm extending parallel to the fixed arm and having means for supporting the wafer receptacle, and a pair of connecting arms connecting the fixed arm and the horizontally movable arm, forming a parallel link, wherein said wafer receptacle supporting means comprises movable holders movable toward, and away from, each other, to hold, and release, the wafer receptacle at both ends thereof.

2. The apparatus according to claim 1, wherein said wafer receptacle has a hole, and said receptacle-inserting/extracting means has a hook, and inserts the wafer receptacle into, and extracts the wafer receptacle from, the desired one of said processing units, with said hook inserted in the hole of the wafer receptacle.

3. The apparatus according to claim 1, wherein said receptacle-inserting/extracting means comprises a fork having a distal end, said wafer support member being integrally formed with this distal end.

4. The apparatus according to claim 1, wherein said processing units are horizontally extending heating furnaces arranged one above another.

5. The apparatus according to claim 1, wherein said horizontal transport mechanism further includes a horizontally movable member having an engaging portion, and a lever member rotatably attached at one end to a lower surface of said fixed arm and abutting at the other end on said engaging portion, such that when said horizontally movable member is moved horizontally, said lever rotates, whereby said connecting arms rotate, so that said horizontally movable arm horizontally moves in parallel to said fixed arm.

6. The apparatus according to claim 5, wherein said elevator mechanism further includes a vertically movable member to which said fixed arm is fixed at one end, and a feed screw member penetrating said vertically movable member in screw engagement therewith, so that when said feed screw is driven, said vertically movable member is moved up or down.

* * * * *